(12) United States Patent
Gründker et al.

(10) Patent No.: US 10,935,095 B2
(45) Date of Patent: Mar. 2, 2021

(54) CABLE ADAPTER AND METHOD FOR COLLECTING AND FORWARDING ANALOG SIGNALS FROM A PLURALITY OF SENSORS IN A MOTOR VEHICLE

(71) Applicant: WABCO Europe BVBA, Brussels (BE)

(72) Inventors: Oliver Gründker, Wedemark (DE); Michael John, Lehrte (DE); Dirk Müntefering, Wedemark (DE)

(73) Assignee: WABCO Europe BVBA, Brussels (BE)

( * ) Notice: Subject to any disclaimer, the term of this patent is extended or adjusted under 35 U.S.C. 154(b) by 0 days.

(21) Appl. No.: 16/552,047

(22) Filed: Aug. 27, 2019

(65) Prior Publication Data
US 2020/0072309 A1 Mar. 5, 2020

(30) Foreign Application Priority Data

Aug. 30, 2018 (EP) .................................... 18191609

(51) Int. Cl.
| | | |
|---|---|---|
| F16D 66/02 | (2006.01) | |
| H04L 12/40 | (2006.01) | |
| G01R 31/00 | (2006.01) | |
| G05B 19/04 | (2006.01) | |

(52) U.S. Cl.
CPC ......... *F16D 66/027* (2013.01); *F16D 66/024* (2013.01); *G01R 31/006* (2013.01); *G05B 19/04* (2013.01); *H04L 12/40* (2013.01); *H04L 2012/40273* (2013.01)

(58) Field of Classification Search
CPC .... F16D 66/027; F16D 66/024; G01R 31/006
USPC .......................................................... 340/454
See application file for complete search history.

(56) References Cited

U.S. PATENT DOCUMENTS

| | | | |
|---|---|---|---|
| 5,442,170 A | 8/1995 | Kreft et al. | |
| 5,848,672 A * | 12/1998 | Brearley | F16D 65/18 188/1.11 L |
| 10,216,559 B2 * | 2/2019 | Fernandez | G06F 11/0739 |
| 2004/0075450 A1 * | 4/2004 | Buge | G01P 3/489 324/710 |
| 2017/0163366 A1 | 6/2017 | Aichriedler | |

FOREIGN PATENT DOCUMENTS

| | | |
|---|---|---|
| DE | 3010498 A1 | 9/1981 |
| DE | 3333333 A1 | 3/1985 |
| DE | 10054745 A1 | 12/2001 |

\* cited by examiner

*Primary Examiner* — John A Tweel, Jr.
(74) *Attorney, Agent, or Firm* — Dickinson Wright PLLC

(57) ABSTRACT

A cable adapter (1) for collecting and forwarding analog signals from a plurality of sensors (103, 105) in a motor vehicle (100), in particular brake lining wear sensors of a utility vehicle disc brake, has first and second signal input terminals (5, 7) for connecting the cable adapter (1) to sensors (103, 105) and for receiving signal currents (20, 22). The cable adapter (1) has a signal output terminal for connecting the cable adapter (1) to an electronic control unit (113) of the motor vehicle (100) and switching electronics (13) that are configured to transmit the first and second signal currents (20, 22; 21, 23; 21', 23') to the signal output terminal (9) at a predetermined rhythm.

16 Claims, 3 Drawing Sheets

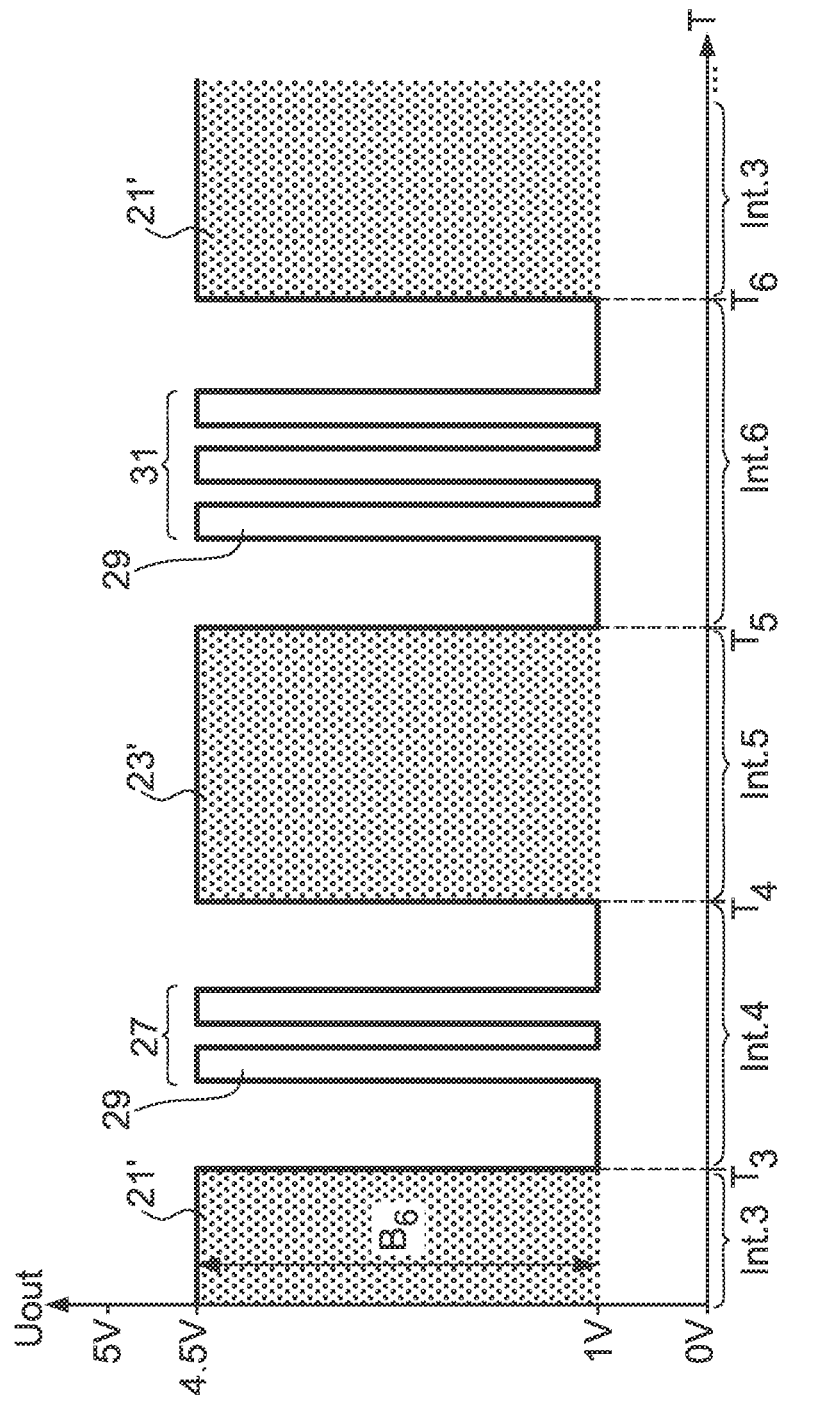

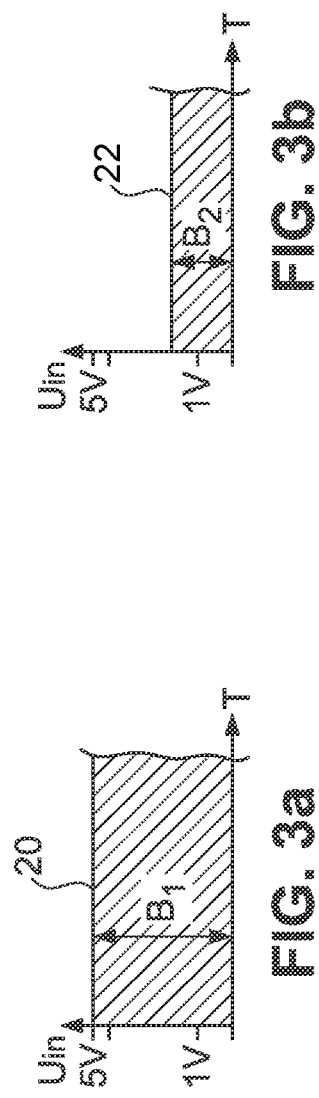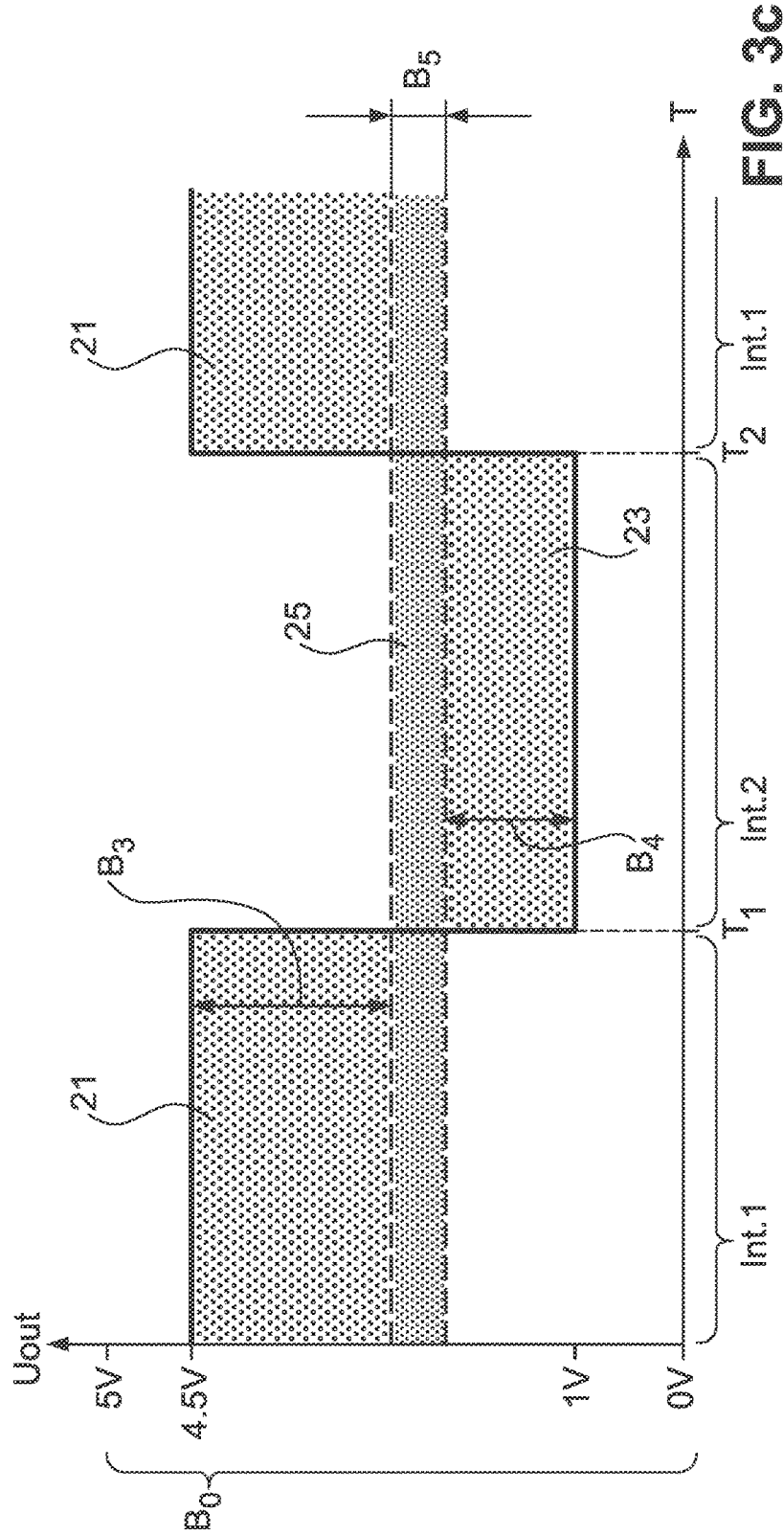

CABLE ADAPTER AND METHOD FOR COLLECTING AND FORWARDING ANALOG SIGNALS FROM A PLURALITY OF SENSORS IN A MOTOR VEHICLE

TECHNICAL FIELD

The present disclosure relates to a cable adapter for collecting and forwarding analog signals from a plurality of sensors in a motor vehicle, in particular from brake lining wear sensors of a utility vehicle disc brake. The present disclosure furthermore relates to a method for collecting and forwarding analog signals from a plurality of sensors in a motor vehicle, in particular from brake lining wear sensors of a utility vehicle disc brake.

BACKGROUND

Motor vehicles have over the last few decades evolved into very complex products that connect a plurality of mechanical and electronic components to form an overall system. Many aspects in the operation of a motor vehicle, in particular also of a utility vehicle, are monitored and/or controlled by sensors. These sensors in this case generally generate signal currents that are transmitted via data lines to one or more electronic control units of vehicle electronics and are stored, further processed or read there.

The expenditure for linking all of the sensors of a vehicle to the corresponding vehicle electronics components in a manner able to channel signals is considerable, as is the length and complexity of the cable harnesses required for this purpose within the vehicle.

Vehicle manufacturers use specific data lines and data interfaces for communication with the components of the vehicle electronics that are present in the vehicle, to which data lines and data interfaces the sensors of peripheral devices and functional assemblies of the motor vehicle have to be connected. One example of such functional assemblies are for example the brakes of the motor vehicle, in particular disc brakes. Disc brakes have for example a brake lining wear sensor that generates a continuous analog signal that is able to be evaluated with regard to the wear state of the brake linings by vehicle electronics. Depending on the brake manufacturer, however, the brakes do not have just one sensor, but some also have more than one sensor. If a brake having more than one sensor is then intended to be connected to a motor vehicle in a manner able to channel signals, it was necessary for such systems, in the prior art in the past, to lay an additional signal line for the sensor that was additionally present, which entailed considerable installation expenditure.

SUMMARY

It was therefore sought to improve the prior art such that the interface architecture present in the vehicle, in particular the data lines present in the vehicle that lead to the respective vehicle electronics, is able to be used for the flexible use of functional assemblies having one or more sensors, without having to lay additional data lines.

The present disclosure was therefore based on the object of increasing the flexibility of the use in data lines with regard to the vehicle electronics in a motor vehicle, in particular utility vehicle. The present disclosure was in particular furthermore based on the object of being able to transmit the signals from a plurality of sensors to vehicle electronics, and in the process to keep the required installation expenditure for cable lines as low as possible.

The present disclosure achieves the object on which it is based by proposing a cable adapter for collecting and forwarding analog signals from a plurality of sensors in a motor vehicle, in particular brake lining wear sensors of a utility vehicle disc brake, wherein the cable adapter has: a first signal input terminal for connecting the cable adapter to a first sensor and for receiving a first signal current; a second signal input terminal for connecting the cable adapter to a second sensor and for receiving a second signal current; a signal output terminal, connected to the signal input terminals in a manner able to channel signals, for connecting the cable adapter to an electronic control unit of the motor vehicle via a line, wherein the cable adapter has switching electronics that are configured to transmit the first and second signal currents, in particular alternately, to the signal output terminal at a predetermined rhythm.

The line connected to the signal output terminal is in particular a data line already installed in the vehicle and having a predefined data interface. The data interface will differ in practice from case to case depending on the client, and the cable adapter will in each case be adjusted to the data interface such that it is able to be connected thereto. One particularly preferred data interface for connection to the signal output terminal of the cable adapter is for example an analog 0-5 V interface.

The present disclosure makes use of the finding that it is possible, by transmitting the plurality of incoming signal currents in a rhythm with very little structural and very low circuitry expenditure, to transmit the sensor signals, in particular from the brake lining wear sensors of a utility vehicle disc brake, to the electronic control unit of the vehicle. This is based primarily on the idea that the lining wear sensors do not have to ensure monitoring in real time, because the wear of the brake linings is gradual and occurs over relatively long time intervals. Although, when reaching a particular wear value, it is important that the operator of the motor vehicle is made aware of this, it is however generally not decisive that the event upon which a predetermined critical wear value occurs is communicated precisely to within hundredths of a second. It is therefore not detrimental if the cable adapter with its switching electronics transmits the incoming signal currents only alternately, and thus with losses, as it were, to the signal output terminal and thus to the electronic control unit at predetermined time intervals.

The present disclosure is advantageously developed by the signal output terminal having a predetermined output bandwidth and the switching electronics being configured to code the incoming first and second signal currents and to transmit them as a coded output signal current. Particularly preferably, the electronic control unit of the motor vehicle is then of course configured to decode the coded output signal current. Coding the signal currents is understood here to mean that the switching electronics are able to convert the incoming signal currents into another signal form without however interpreting the essential signal content or even manipulating it. Examples of a non-manipulative conversion are for example positively or negatively amplifying the incoming signal currents, transposing the signal currents into predetermined bandwidths, adding identifiers before or after signal currents divided into packets, or converting the signal currents from an analog signal into a digital signal. This is explained in each case in the following exemplary embodiments.

In one preferred exemplary embodiment, the switching electronics are thus configured to code the incoming first signal current into a first predetermined signal band having a bandwidth that is narrower than the bandwidth of the signal output terminal, to code the incoming second signal current into a second predetermined signal band having a bandwidth that is narrower than the bandwidth of the signal output terminal, and to transmit the signal currents coded into the signal bands to the signal output terminal as a coded output signal current. As a result, the various incoming signal currents may each be shifted by the switching electronics into a characteristic bandwidth that is detected, on the output side, by an electronic control unit connected to the signal output terminal in a manner able to channel signals.

The electronic control unit is then preferably programmed such that it automatically assigns that signal information that lies in the first predetermined signal band to a first sensor and those signal portions that lie in the second signal band to the second sensor. The higher the number of sensors connected to the cable adapter, the lower the bandwidth available for each sensor. However, it advantageously becomes noticeable here that not all sensors generally transmit signals that require the entire bandwidth of the signal output terminal or of the line connected thereto. One or more sensors out of the number of sensors will generally be what are known as black/white sensors, which thus communicate only a I/O signal for the presence or absence of a particular state. Such sensors are preferably assigned to a narrower signal band than sensors that generate more complex signal profiles.

In a further preferred embodiment, the sum of the bandwidths of the first and second (coded) signal bands is lower than the bandwidth of the signal output terminal, and the first and second signal bands are preferably spaced from one another. Particularly preferably, a safety distance, that is to say a signal band that remains unoccupied, is in each case provided between adjacent signal bands. This prevents the signals present at the signal output terminal from being incorrectly assigned by the downstream electronic control unit.

In one alternative preferred embodiment, the signal output terminal has a predetermined bandwidth, but the switching electronics are in this case configured to transmit the incoming signal currents in each case in their full bandwidth to the signal output terminal or, if the bandwidth of the incoming signal currents is higher than the bandwidth of the signal output terminal, to code the incoming signal currents into a signal band having the predetermined bandwidth, in particular to (positively or negatively) amplify them, and to transmit the incoming signal currents in the predetermined bandwidth.

More preferably, the switching electronics are configured to transmit an identification signal to the signal output terminal in each case upon a change from the transmission of one signal current to the next signal current, which identification signal is representative of the signal current that then follows. This makes it easier for the downstream electronic control unit to correctly assign the alternately transmitted signals to the first and second sensors.

The identification signal may in this case preferably be present in the form of a predetermined number of voltage pulses characteristic of the respective signal current.

In a further preferred embodiment, the signal input terminals are in each case voltage signal terminals, and preferably have a bandwidth in a range from 0 V to 12 V, more preferably in a range from 0 V to 5 V.

More preferably, the signal output terminal is likewise an analog voltage signal terminal and is preferably configured in a bandwidth in a range from 0 V to 12 V, more preferably in a range from 0 V to 5 V. This is the data interface that is most commonly used at present for communication with lining wear sensors of motor vehicle disc brakes or optionally also breakage sensors, etc., which data interface is already present multiple times in the motor vehicle. The cable adapter according to the present disclosure in this embodiment permits communication of a plurality of analog sensors with this single analog interface in a particularly exemplary manner, without requiring additional cable installations and without having to lay further signal inputs on the system-side input electronics.

As an alternative to the purely analog case of application outlined above, there is however also provision in preferred exemplary embodiments for the signal output terminal to be a digital signal output terminal and for the switching electronics to be configured to code the incoming signal currents into a signal of a digital data interface. The digital data interface may be configured for example as a point-to-point interface or as a bus interface, in particular selected from the list consisting of: pulse width modulation (PWM); single edge nibble transmission (SENT); peripheral sensor interface 5 (PSI5); or field bus, in particular local interconnect network (LIN) or controller area network (CAN).

The present disclosure has been described above in a first aspect with reference to the cable adapter according to the present disclosure. In a further aspect, the present disclosure, as mentioned at the outset, however also relates to a method for collecting and forwarding analog signals from a plurality of sensors in a motor vehicle. The present disclosure achieves the object mentioned at the outset by the method comprising the steps of: —receiving a first signal current from a first sensor; receiving a second signal current from a second sensor, in particular via a cable adapter connected to the sensors via respective signal input terminals, and alternately transmitting the first and second signal currents at a predetermined rhythm, in particular via a signal output terminal of the cable adapter.

The method according to the present disclosure fully adopts the advantages and preferred embodiments of the cable adapter described in the first aspect. The preferred embodiments of the cable adapter are therefore equally preferred embodiments of the method according to the present disclosure.

The method is incidentally advantageously developed by the first and second signal currents being transmitted via the signal output terminal in a predetermined bandwidth, and the method comprises: —coding the incoming first signal current and coding the incoming second signal current.

The coding preferably comprises: coding the incoming first signal current into a first predetermined signal band having a bandwidth that is narrower than the bandwidth of the signal output terminal; coding the incoming second signal current into a second predetermined signal band having a bandwidth that is narrower than the bandwidth of the signal output terminal, and transmitting the signal currents coded into the signal bands to the signal output terminal; wherein the sum of the bandwidths of the signal bands is preferably lower than the bandwidth of the signal output terminal, and more preferably the first and second signal bands are spaced from one another.

More preferably, the transmission is carried out via the signal output terminal in a predetermined output bandwidth, and the method comprises:

a) transmitting the incoming signal currents in each case in their full bandwidth to the signal output terminal, or b) coding the incoming signal currents in each case into a signal band having the predetermined output bandwidth, and transmitting the incoming signal currents in the predetermined output bandwidth.

The method then furthermore preferably comprises transmitting an identification signal to the signal output terminal in each case upon a change from the transmission of one signal current to the next signal current, which signal is representative of the signal current that then follows, and then, more preferably, the identification signal is present in the form of a predetermined number of voltage pulses characteristic of the respective signal current.

More preferably, the signal input terminals are in each case voltage signal terminals, and preferably have a bandwidth in a range from 0 V to 12 V, more preferably in a range from 0 V to 5 V, and the signal output terminal is either a) an analog voltage signal terminal and preferably has a bandwidth of 0 V to 12 V, more preferably in a range from 0 V to 5 V, or b) a digital signal terminal, and the coding furthermore comprises: coding the incoming signal currents into a signal of a digital data interface, which is preferably configured as a point-to-point interface or as a bus interface, preferably a serial bus interface, in particular selected from the list consisting of: pulse width modulation (PWM); single edge nibble transmission (SENT); peripheral sensor interface 5 (PSI5); or field bus, in particular local interconnect network (LIN) or controller area network (CAN). The invention is described in more detail below with reference to the appended drawings on the basis of preferred exemplary embodiments. The drawings are provided herewith for purely illustrative purposes and are not intended to limit the scope of the present invention.

BRIEF DESCRIPTION OF THE DRAWINGS

In the drawings,

FIGS. 2a, 2b, and 2c show a schematic illustration of the operation of the cable adapter in a first preferred variant, and FIGS. 3a, 3b, and 3c show a schematic illustration of the operation of the cable adapter according to the invention in a second preferred variant.

DETAILED DESCRIPTION OF THE DRAWINGS

Figure 1:
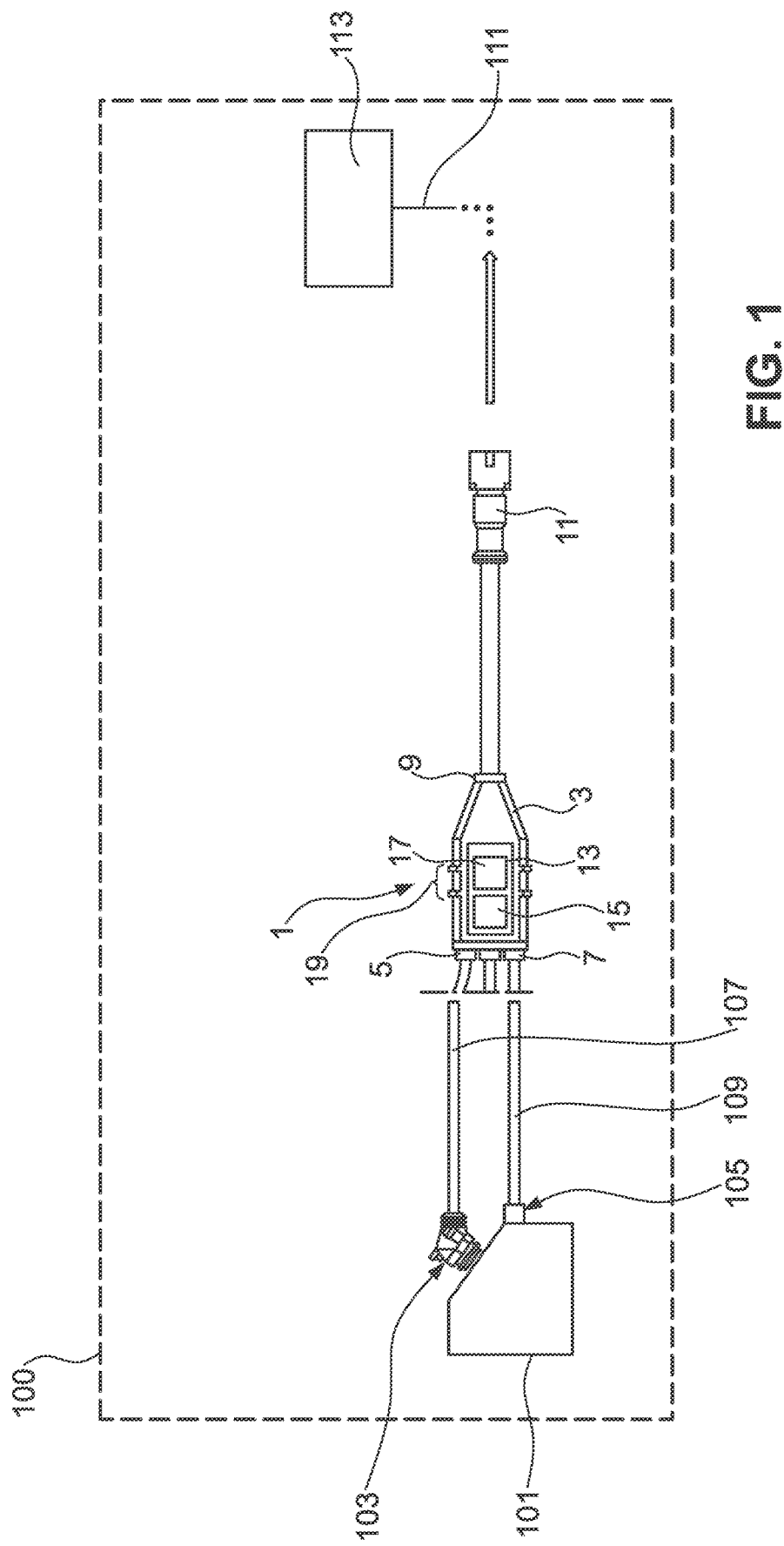
FIG. 1 shows a cable adapter according to one preferred exemplary embodiment.

FIG. 1 schematically shows a motor vehicle 100. The motor vehicle 100 is for example a utility vehicle. The motor vehicle 100 has a brake 101, on which a first sensor 103 and a second sensor 105 are arranged. The sensors 103, 105 are for example wear sensors, in particular components of a modular brake lining wear sensor. The sensors 103, 105 are connected to a cable adapter 1 via corresponding cable lines 107, 109. The cable adapter 1 has a first signal input terminal 5 to which the first sensor 103 is connected and a second signal input terminal 7 to which the second sensor 105 is connected.

The cable adapter 1 furthermore has a signal output terminal 9 that is configured to be connected, or is connected, to an electronic control unit 113 of the vehicle 100 via a cable line 111, for example via a plug connector 11.

The cable adapter 1 has switching electronics 13. The switching electronics 13 are configured to receive a first signal current 20 from the first sensor 103 (cf. FIGS. 2a to 3c) and to receive a second signal current 22 from the second sensor 105 (cf. FIGS. 2a to 3c). The switching electronics 13 are furthermore configured to transmit the first and second signal currents 20, 22 alternately to the signal output terminal 9 at a predetermined rhythm. The switching electronics 13 are preferably configured as a microprocessor, and comprise processor means 15 and memory means 17 on which a program for executing the above-described rhythm ization and transmission is stored.

The operation according to the invention of the cable adapter 1 and of the switching electronics 13 is explained via example in a first exemplary embodiment according to FIGS. 2a to c and a second exemplary embodiment according to FIGS. 3a to c.

The switching electronics 13 perform coding in the exemplary embodiment according to FIGS. 2a to c, which coding in this case involves the switching electronics transmitting the first output signal current 21' with essentially the same bandwidth B6 as that of the incoming signal current 20.

For the sake of simplicity, it is assumed for this exemplary embodiment that the incoming signal currents 20, 22 of the first and second sensors 103, 105 have the same bandwidth B6. The principle could however be applied just as well with bandwidths that are different from one another.

After the time interval Int.3 provided for this purpose has elapsed, the switching electronics 13 perform a transmission change at the time $T_3$. However, before the second output signal current 23', again having the bandwidth B6, is transmitted to the signal output terminal 9, the switching electronics 13, during a time interval Int.4 until the time $T_4$, transmit a first number 27 of switchover pulses 29, for example two switchover pulses 29, that is representative of the following signal, that is to say the second output signal current 23'. In this exemplary embodiment, the signal currents are coded via prefixing a respective identifier, that is to say identification element. Following the insertion of the identifier in the form of the switchover pulses 29, the switching electronics transmit the second outgoing signal current 23' for a time interval Int.5 until the time $T_5$. A new transmission change takes place at the time $T_5$. However, before the first outgoing signal current 21' is transmitted again, the switching electronics 13, during a further interval Int.6 until the time $T_6$, transmit a second number 31 of switchover pulses 29 that are characteristic of the first output signal current 21'. In the exemplary embodiment that is shown, the intervals Int.4 and Int.6 are of substantially the same length, as are the intervals Int.3 and Int.5 in which the signal currents 21', 23' are transmitted. Depending on the application, the time intervals may also however be selected so as to differ from one another.

The expenditure on the part of the electronic control unit 113 of the motor vehicle 100 is gratifyingly low in this exemplary embodiment. As well as detecting the number of switchover pulses 27, 31, detecting the respectively following signal current 21', 23' and thus assignment to the first sensor 103 or the second sensor 105 is achieved at all times in a simple manner.

As an alternative or in addition to coding via identifiers, it is also possible, as is apparent from FIGS. 3a to c, to perform bandwidth coding. For this purpose, the switching electronics 13 or the first signal input terminal 5 are fed a first signal current 20, and the second signal input terminal 7 is fed a second signal current 22. The switching electronics 13 code the first incoming signal current 20 into a first coded output signal current 21 having a bandwidth B3 that is lower than the bandwidth B1 of the first incoming signal current 20. Similarly, the switching electronics 13 code the second incoming signal current 22 that has the bandwidth B2 into a second coded output signal current 23 having a bandwidth B4 that is lower than or equal to the bandwidth B2. The sum of the bandwidths B3, B4 of the two coded output signal currents 21, 23 is lower than a total possible bandwidth B0 at the signal output terminal 9, such that it is possible to provide a safety region 25 at unused bandwidths between the bandwidths B3, B4 assumed by the two coded output signal currents 21, 23. The safety region 25 has a bandwidth B5 of for example 0.5 V. It thus becomes possible to transmit the two incoming signal currents 20, 22 alternately to the signal output terminal 9 via the switching electronics 13. First of all, the first coded output signal current 21 is transmitted for a first interval Int.1 until the time $T_1$, and then the second coded output signal current 23 is transmitted for a second interval Int.2 until the time $T_2$, before the first coded output signal current 21 is transmitted again to the signal output terminal 9.

In the exemplary embodiment shown in FIGS. 3a-c, the time intervals Int.1 and Int.2 are of roughly the same size. They could however also be of different sizes, depending on the time intervals in which it is desired or necessary to relay corresponding status information from the sensors 103, 105 to the electronic control unit 113 of the vehicle 100. The programming expenditure for the electronic control unit 113 for making it possible to decode the coded output signal current 21, 23 and to identify the signal currents belonging to the respective sensors 103, 105 is gratifyingly low in the exemplary embodiment. The first or second coded output signal current 21, 23 may be detected directly using the bandwidths B3, B4 respectively characteristic of the signal current 21, 23.

If necessary, decoding may be performed in the original bandwidth B1, B2.

The invention claimed is:

1. A cable adapter (1) for collecting and forwarding analog signals from a plurality of sensors (103, 105) in a motor vehicle (100) comprising:
a first signal input terminal (5) for connecting the cable adapter (1) to a first sensor (103) and for receiving a first signal current (20),
a second signal input terminal (7) for connecting the cable adapter (1) to a second sensor (105) and for receiving a second signal current (22),
a signal output terminal (9), connected to the signal input terminals in a configuration for channeling signals, for connecting the cable adapter (1) to an electronic control unit (113) of the motor vehicle (100) via a line (111),
wherein the cable adapter (1) has switching electronics (13) that are configured to transmit the first and second signal currents (20, 22; 21, 23; 21', 23') to the signal output terminal (9) at a predetermined rhythm,
wherein the signal output terminal (9) has a predetermined output bandwidth ($B_0$), and the switching electronics (13) are configured
to code the incoming first and second signal currents (20, 22) and to transmit them as a coded output signal current (21, 23; 21', 23'),
to code the incoming first signal current (20) into a first predetermined signal band having a first bandwidth ($B_3$) that is narrower than the output bandwidth ($B_0$) of the signal output terminal (9),
to code the incoming second signal current (22) into a second predetermined signal band having a second bandwidth ($B_4$) that is narrower than the output bandwidth ($B_0$) of the signal output terminal (9), and
to transmit the first and second signal currents (21, 23; 21', 23') coded into the first and second signal bands to the signal output terminal (9) as a coded output signal current.

2. The cable adapter (1) as claimed in claim 1, wherein the plurality of sensors is composed of brake lining wear sensors of a utility vehicle disc brake.

3. The cable adapter (1) as claimed in claim 1, wherein the sum of the first and second bandwidths (B3, B4) of the first and second signal bands is narrower than the output bandwidth ($B_0$) of the signal output terminal (9), and the first and second signal bands are spaced from one another.

4. A cable adapter (1) for collecting and forwarding analog signals from a plurality of sensors (103, 105) in a motor vehicle (100) comprising:
a first signal input terminal (5) for connecting the cable adapter (1) to a first sensor (103) and for receiving a first signal current (20),
a second signal input terminal (7) for connecting the cable adapter (1) to a second sensor (105) and for receiving a second signal current (22),
a signal output terminal (9), connected to the signal input terminals in a configuration for channeling signals, for connecting the cable adapter (1) to an electronic control unit (113) of the motor vehicle (100) via a line (111),
wherein the cable adapter (1) has switching electronics (13) that are configured to transmit the first and second signal currents (20, 22; 21, 23; 21', 23') to the signal output terminal (9) at a predetermined rhythm,
wherein the signal output terminal (9) has a predetermined output bandwidth ($B_0$), and the switching electronics (13) are configured to transmit the incoming first and second signal currents (20, 22) in a respective full bandwidth ($B_6$) to the signal output terminal (9), or to code them into a signal band having the predetermined output bandwidth and to transmit the incoming first and second signal currents (20, 22) in the predetermined output bandwidth.

5. The cable adapter (1) as claimed in claim 4, wherein the switching electronics (9) are configured to transmit a respective identification signal to the signal output terminal (9) upon a change from a transmission of one signal current (21') to a subsequent signal current (23'), wherein the identification signal is representative of the subsequent signal current.

6. The cable adapter (1) as claimed in claim 5, wherein the identification signal is composed of a predetermined number (27, 31) of voltage pulses (29) characteristic of the subsequent signal current.

7. The cable adapter (1) as claimed in claim 1, wherein the signal input terminals (5, 7) are voltage signal terminals.

8. The cable adapter (1) as claims in claim 6, wherein the signal input terminals (5, 7) have a respective bandwidth in the range of 0 V to 12 V.

9. The cable adapter (1) as claimed in claim 7, wherein the signal output terminal (9) is an analog voltage signal terminal.

10. The cable adapter (1) as claims in claim 9, wherein the signal output terminal (9) has a bandwidth in the range of 0 V to 12 V.

11. The cable adapter (1) as claimed in claim 1, wherein the signal output terminal (9) is a digital signal output terminal and the switching electronics are configured to code the incoming signal currents (20, 22) into a signal of a digital data interface.

12. The cable adapter (1) as claimed in claim 11, wherein the digital data interface is configured to code the incoming signal currents (20, 22) into a signal of a format selected from the list consisting of:
- pulse width modulation (PWM),
- single edge nibble transmission (SENT),
- peripheral sensor interface 5 (PSI5), or
- field bus.

13. A method for collecting and forwarding analog signals from a plurality of sensors (103, 105) in a motor vehicle (100) comprising the steps:
- receiving a first signal current (20) from a first sensor (103) via a first input terminal (5),
- receiving a second signal current (22) from a second sensor (105) connected to the sensors (103, 105) via a second input terminal (7),
- coding the received first signal current (20) into a first predetermined signal band having a first bandwidth (B3) that is narrower than a predetermined output bandwidth ($B_O$) of the signal output terminal (9),
- coding the received second signal current (22) into a second predetermined signal band having a second bandwidth (B4) that is narrower than the predetermined output bandwidth ($B_O$) of the signal output terminal (9), and
- alternately transmitting the coded first and second signal currents (21, 23; 21', 23') into the first and second signal bands to the signal output terminal (9) a predetermined rhythm via a signal output terminal (9) of the cable adapter (1),
- wherein the sum of the first and second bandwidths (B3, B4) of the first and second signal bands is narrower than the predetermined output bandwidth ($B_O$) of the signal output terminal (9).

14. The method as claimed in claim 13, wherein the plurality of sensors is composed of brake lining wear sensors of a utility vehicle disc brake.

15. The method as claimed in claim 13, wherein the first and second signal bands are spaced from one another.

16. The method as claimed in claim 14,
- wherein the step of transmitting is carried out via the signal output terminal (9) within the predetermined output bandwidth ($B_O$), and the method comprises:
- transmitting the incoming first and second signal currents (20, 22) in respective full bandwidths ($B_6$) to the signal output terminal (9), or
- coding the incoming first and second signal currents into a signal band having the predetermined output bandwidth, and transmitting the incoming signal currents in the predetermined output bandwidth.

* * * * *